United States Patent [19]

Isshiki

[11] Patent Number: 5,020,068

[45] Date of Patent: May 28, 1991

[54] SEMICONDUCTOR LASER DEVICE

[75] Inventor: Kunihiko Isshiki, Itami, Japan

[73] Assignee: Mitsubishi Denki Kabushiki Kaisha, Tokyo, Japan

[21] Appl. No.: 432,215

[22] Filed: Nov. 6, 1989

[30] Foreign Application Priority Data

Nov. 9, 1988 [JP] Japan .................. 63-283291

[51] Int. Cl.$^5$ ............................................. H01S 3/19
[52] U.S. Cl. ......................................... 372/46; 372/45; 372/49
[58] Field of Search .................. 372/45, 46, 43, 44, 372/49

[56] References Cited

U.S. PATENT DOCUMENTS 4,546,481 10/1985 Yamamoto et al. ............... 372/45
4,769,821 9/1988 Gotoh .................................. 372/45

FOREIGN PATENT DOCUMENTS 60-101989 6/1985 Japan .

OTHER PUBLICATIONS

"High-Power Operation of Index-Guided Visible GaAs/GaAlAs Multiquantum Well Lasers", K. Uomi et al., Appl. Phys. Lett., 45(8), Oct. 15, 1984, pp. 818-820.
"SIMS Study of Compositional Disordering in Si Ion Implanted AlGaAs-GaAs Superlattice", J. Kobayashi et al., Japanese Journal of Applied Physics, vol. 25, No. 5, May 1986, pp. L385-L387.
"AlGaAs Window Stripe Buried Multiquantum Well Lasers", H. Nakashima et al., Japanese Journal of Applied Physics, vol. 24, No. 8, Aug. 1985, pp. L647-L649.
"High Power (2.1W) 10-Stripe AlGaAs Laser Arrays With Si Disordered Facet Windows", R. L. Thornton et al., Appl. Phys. Lett., 49(23), 12/08/86, pp. 1572-1574.

Primary Examiner—Georgia Epps
Attorney, Agent, or Firm—Leydig, Voit & Mayer

[57] ABSTRACT

A multi-quantum well laser having a self-aligned structure which limits catastophic optical damage by producing window regions near the facets without significantly decreasing the efficiency of the laser. The semiconductor laser includes at least a first conductivity type lower cladding layer, an active layer including a multi-quantum well structure, a second conductivity type first upper cladding layer, a first conductivity type current blocking layer, and a second conductivity type second upper cladding layer successively disposed on a first conductivity type semiconductor substrate. The current blocking layer has a central elongate stripe shaped current confinement groove extending between the laser facets which stabilizes the transverse mode and confines current to a channel-like region in the active layer. First conductivity type dopant impurities form disordering regions located adjacent the facets which invade and disorder the multi-quantum well active layer to create disordered active layer regions. Second conductivity type dopant impurities form separating regions located adjacent the faects which separate the current blocking layer and the disordering regions to prevent current leakage between the current blocking layer and the disordering regions.

11 Claims, 8 Drawing Sheets

SEMICONDUCTOR LASER DEVICE

FIELD OF THE INVENTION

The present invention relates to a semiconductor laser device and production method thereof, and more particularly to semiconductor lasers having non-absorbing mirror structures capable of realizing high power and high reliability operation.

BACKGROUND OF THE INVENTION

Semiconductor lasers having multi-quantum well active layers have become desirable because these lasers have several superior properties compared with conventional double heterostructure lasers. These superior properties include lower threshold currents, better threshold current temperature dependence, and shorter emission wavelengths. In order to utilize multi-quantum well lasers having a visible light wavelength, a stable transverse mode must be realized using a built-in refractive index optical waveguide. In order to obtain stable transverse mode oscillation, semiconductor lasers have been developed utilizing a self-aligned structure, i.e., a built-in optical and current confinement structure which stabilizes the transverse mode.

FIG. 5 shows a cross-sectional view of a multi-quantum well laser having a self-aligned structure as described in Applied Physics Letters Vol. 45, pp. 818-820 (1984). In FIG. 5, the self-aligned structure is characterized by a stripe shaped groove 10 produced by removing a central stripe portion of a highly absorbing n-type GaAs current blocking layer 5. A thin (0.2 μm) p-type AlGaAs first upper cladding layer 4 is positioned between current blocking layer 5 and an active layer 3 having a multi-quantum well structure. As described in further detail below, this structure provides a built-in optical wavelength to stabilize the transverse mode. Additionally, this structure restricts current injection to the region within stripe shaped groove 10 because of the current blocking reverse biased pn junction formed between current blocking layer 5 and first upper cladding layer 4.

The self-aligned structure shown in FIG. 5 is produced by successively growing an n-type $Al_{0.45}Ga_{0.55}As$ lower cladding layer 2, multi-quantum well active layer 3, p-type $Al_{0.45}Ga_{0.55}As$ first upper cladding layer 4, and n-type GaAs current blocking layer 5 on an n-type GaAs substrate 1 by vapor phase epitaxy. Relative positional terms such as "upper" and "lower" are used herein not to limit the overall device to a particular orientation in space, but simply to distinguish between different layers. Thus, the lower cladding layer does not necessarily prohibit the laser from being operated in inverted configuration, but is simply to suggest that the lower cladding layer is the cladding layer closest to the substrate. After this first epitaxial growth process, stripe shaped groove 10 is produced by selectively etching a central stripe portion of current blocking layer 5 using conventional photolithography and etching techniques. Thereafter, a p-type $Al_{0.45}Ga_{0.55}As$ second upper cladding layer 6 and a p-type GaAs contact layer 7 are grown in a second epitaxial growth process. Metal electrodes 8 and 9 are then disposed on the bottom surface of substrate 1 and on contact layer 7, respectively. Finally, the wafer upon which the lasers are grown is separated into chips, thereby completing the self-aligned structure laser devices.

In the multi-quantum well laser of FIG. 5, a pn junction exists between active layer 3 via p-type first upper cladding layer 4 and n-type lower cladding layer 2. As previously stated, the reverse biased current blocking pn junction existing between current blocking layer 5 and first upper cladding layer 4 confines current flow to the stripe shaped groove 10. Thus, stripe shaped groove 10 defines a channel-like region in active layer 3. When a forward bias voltage is applied to the pn junction across active layer 3 through metal electrodes 8 and 9, current flows concentratedly through stripe shaped groove 10 and carriers are injected into and confined to the channel-like region of active layer 3. When current above the threshold current level flows through active layer 3, carrier recombinations generate photons and lasing action is sustained. Because lower cladding layer 2 and first upper cladding layer 4 have a higher aluminum content than active layer 3, these layers have a lower index of refraction so that photons leaving active layer 3 are refracted back into it. Additionally, the cladding layers have a wider energy band gap which discourages carriers from overshooting active layer 3 after injection.

As stated previously, the self-aligned structure of FIG. 5 provides a built-in optical waveguide to stabilize the transverse mode. In this structure, the evanescent optical field penetrates into the highly absorbed n-type GaAs current blocking layer 5 through the thin first upper cladding layer 4 outside stripe shaped groove 10. Thus, the transverse mode is confined to stripe shaped groove 10. Current blocking layer 5 therefore provides an effective optical refraction differential in the multi-quantum well of active layer 3, so that the transverse mode is stabilized and photons are confined to the channel-like region of active layer 3. These photons oscillate between facets of the laser until they are ultimately ejected through one of the facets to produce a beam of coherent radiation.

In the prior art semiconductor laser of FIG. 5, when the wafers are cleaved to produce individual devices, mirrors are created at the device edges or facets which produce and enhance photon oscillation in the active layer to produce coherent radiation. However, as a result of the cleavage operation, crystal defects occur at the edges of the laser which absorb photons in the active layer near the mirrors. This optical absorption serves to increase the temperature at the laser facets and causes what is known as catastrophic optical damage. The possibility of catastrophic optical damage limits the maximum output power of semiconductor lasers. Additionally, the temperature increase due to optical absorption degrades the laser at the facets, reduces life and can ultimately destroy the laser.

In multi-quantum well lasers which are not of the self-aligned structure type, the semiconductor layers are typically segregated into those of one conductivity type above the active layer and the opposite conductivity type below the active layer. Impurities or other means are used to disorder the multi-quantum well along its edges to define a nondisordered central channel-like active layer region. Those impurities tend to reduce or prevent current injection in the disordered region, confining current flow in the active layer to the central channel-like region. The same mechanism is thus available for disordering the active layer to form window regions at the laser facets. This mechanism is effective both in confining current to the channel-like active layer region, and in creating window regions to prevent optical absorption at the facets.

To the extent the window regions are created by impurities of a given conductivity type in such lasers, that conductivity type can be coordinated with the segregated conductivity types above or below the active layer to reduce current leakage through the device. However, as can be seen in FIG. 5, the segregation of p-type and n-type regions in a self-aligned structure multi-quantum well laser is not as complete. More particularly, while it is possible to keep all of the layers below the active layer of a given conductivity type, such as n-type, the layers above the active layer must be of both conductivity types so that the current blocking layer can form a reverse biased junction with one of the upper cladding layers. This intermixing of n-type and p-type layers above the active layer can present difficulties in eliminating current leakage if impurities are introduced into the upper cladding layers for forming window regions as is conventional in the aforementioned prior art lasers.

Applicants believe it is for these reasons that when it was desired to achieve the high efficiency of the self-aligned structure multi-quantum well laser, power limitations due to catastrophic optical damage were accepted in order to avoid the possibility of current leakage which would decrease the efficiency of the device. While it might be technically possible to increase the power output of a self-aligned structure laser by introducing a window structure, the possibility of increased current leakage, resulting from the impurities needed for the window structure, led to a decrease in efficiency which made such an approach undesirable.

SUMMARY OF THE INVENTION

In view of the foregoing, it is a general aim of the present invention to provide a semiconductor laser having a self-aligned structure and being capable of realizing a higher power output and higher reliability than self-aligned semiconductor lasers of the past.

In accomplishing that aim, it is an object of the present invention to provide window regions in a quantum well laser having a self-aligned structure without substantially reducing the efficiency of the device. These window regions prevent optical absorption in the active layer near the facets thereby preventing catastrophic optical damage and creating a non-absorbing mirror structure.

An additional object of the present invention is to provide a method of producing a semiconductor laser having such properties.

It is a feature of the present invention that in a laser having a quantum well active layer and a self-aligned structure, first conductivity type impurities form disordering regions located adjacent the laser facets which invade and disorder the multi-quantum well to create disordered active layer regions. Second conductivity type impurities form separating regions located adjacent the laser facets to separate the current blocking layer of the self-aligned structure and the disordering regions, thus preventing current leakage through the window region. Because the disordered active layer regions have a larger energy band gap than the quantum well active layer, photons traveling through the active layer are not absorbed in the disordered active layer regions, and a non-absorbing mirror structure is produced, to realize a higher power operation than past devices. However, because the current blocking layer and the disordering regions are both of the first conductivity type, a possible current leakage path would exist. The separating regions therefore obstruct this current leakage path between the current blocking layer and the disordering regions to maintain the high efficiency of the self-aligned structure.

It is yet another feature of the semiconductor laser of the present invention that the loss due to free carrier absorption in the window regions is reduced, and a quantum well laser having low threshold current and a high external quantum efficiency is realized. In practicing this feature of the present invention, the impurities forming the disordering regions are comprised of Si having a low carrier concentration of about $3 \times 10^{18} cm^{-3}$. Because of this low carrier concentration, free carrier absorption in the window regions can be reduced.

In practicing the present invention, a first conductivity type lower cladding layer, an active layer including a quantum well structure, a second conductivity type first upper cladding layer, and a first conductivity type current blocking layer are successively deposited on a first conductivity type semiconductor substrate. A stripe shaped current confinement groove is formed longitudinally of the laser between the facets by removing a central stripe portion of the current blocking layer. Window regions comprised of first conductivity type disordering regions and second conductivity type separating regions are formed by masking apertures at the laser facets and introducing impurities. The impurities forming the disordering regions invade and disorder the quantum well to create disordered active layer regions, and the impurities forming the separating regions prevent current leakage between the current blocking layer and the disordering regions. In certain embodiments of the present invention, the process steps which produce the current confinement groove are intermixed with those process steps that form the window regions. Namely, the current confinement groove is formed by, for example, etching portions of the current blocking layer, introducing impurities to form the window regions, and further etching the current blocking layer to produce the current confinement groove. At least a second upper cladding layer of the second conductivity type is deposited on the current blocking layer which buries the stripe shaped current confinement groove.

According to the present invention, in a quantum well laser having a self-aligned structure, the window regions formed to create the non-absorbing mirror structure limit the effects of catastrophic optical damage without substantially reducing the efficiency of the device. Thus, the semiconductor laser of the present invention realizes a high power and high reliability operation due to its capability of preventing current leakage, reducing the loss due to free carrier absorption in the window regions, and limiting catastrophic optical damage.

Other objects and advantages of the present invention will become apparent from the detailed description when taken in conjunction with the drawings, in which:

DETAILED DESCRIPTION OF THE PREFERRED EMBODIMENTS

While the invention will be described in connection with preferred embodiments, there is no intent to limit it to those embodiments. On the contrary, the intent is to cover all alternatives, modifications, and equivalents included within the spirit and scope of the invention as defined by the appended claims.

Figure 1:
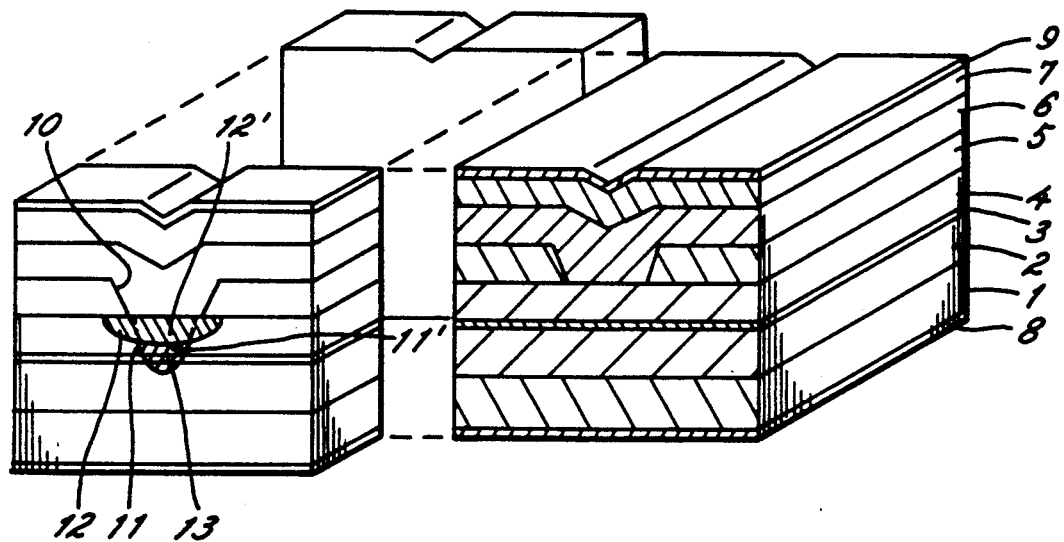
FIG. 1 is a cross-sectional perspective view showing a semiconductor laser device according to a first embodiment of the present invention.
Figure 5:
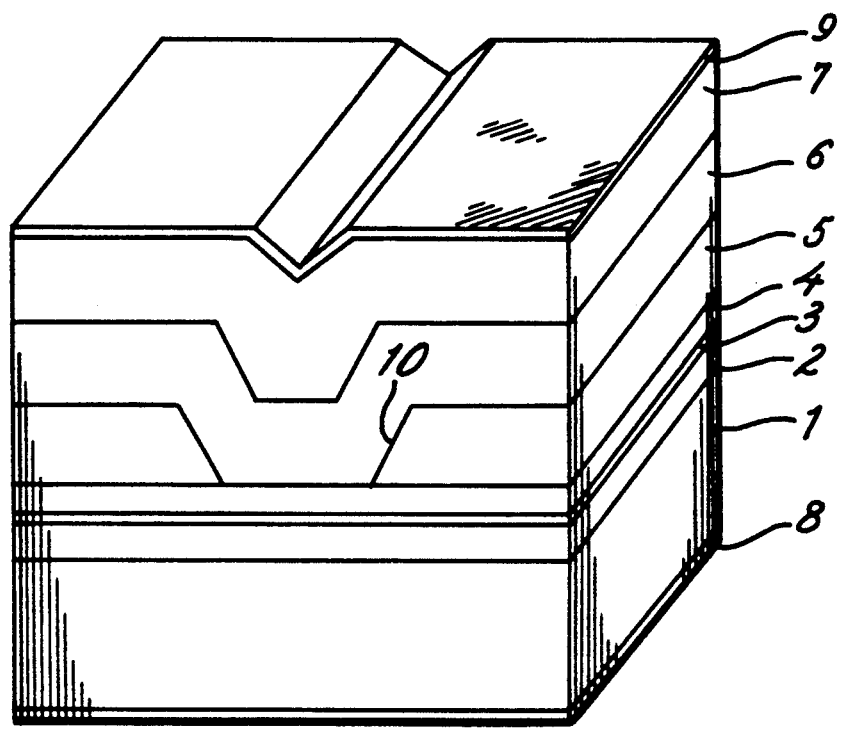
FIG. 5 is a perspective view showing a prior art self-aligned structure laser.

Turning now to the drawings, FIG. 1 shows a cross-sectional perspective view of a semiconductor laser device according to a first embodiment of the present invention. This illustrated embodiment shows a multi-quantum well laser having a self-aligned structure and having window regions located adjacent the laser facets. In this embodiment and the following embodiments described below, the AlGaAs molar proportions for the respective layers of the semiconductor laser can be the same as those described in connection with the self-aligned structure laser of FIG. 5. The multi-quantum well laser of FIG. 1 has an n-type GaAs substrate 1, an n-type AlGaAs lower cladding layer 2, an active layer 3 having a multi-quantum well structure, a p-type AlGaAs first upper cladding layer 4, an n-type GaAs current blocking layer 5, a p-type AlGaAs second upper cladding layer 6, a p-type GaAs contact layer 7, and metal electrodes 8 and 9. The multi-quantum well laser of FIG. 1 also has a stripe shaped confinement groove 10 located in and extending longitudinally through current blocking layer 5.

In accordance with the invention, the multi-quantum well laser of FIG. 1 has window regions located adjacent the laser facets. The window regions are comprised of disordering regions 11 and separating regions 12. Disordering regions 11 extend through active layer 3 and disorder the multi-quantum well structure of active layer 3 to create disordered active layer regions 13. Disordering regions 11 are comprised of n-type impurities such as Si, and separating regions 12 are comprised of p-type impurities such as Zn. By way of shorthand, the impurities are sometimes referred to herein as dopant impurities of the first or second conductivity type. It is appreciated that the impurities are not of a particular conductivity type, but when introduced into a semiconductor material of a particular type create carriers of the first or second conductivity types. However, it is believed that the shorthand reference of impurities of a particular conductivity type will be understood by those skilled in the art in view of this brief statement.

Figure 2A:
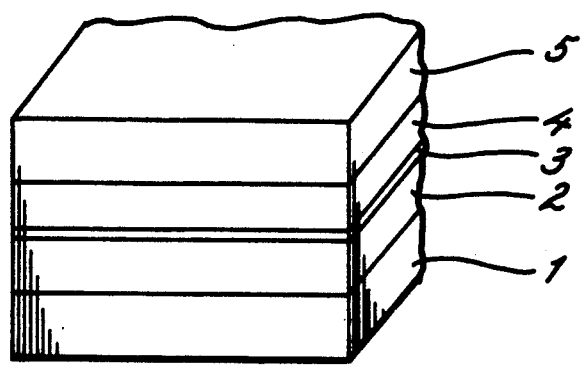
FIGS. 2(a)–2(f) are cross-sectional perspective views showing the production process steps of a method for producing a semiconductor laser device of FIG. 1.
Figure 2B:
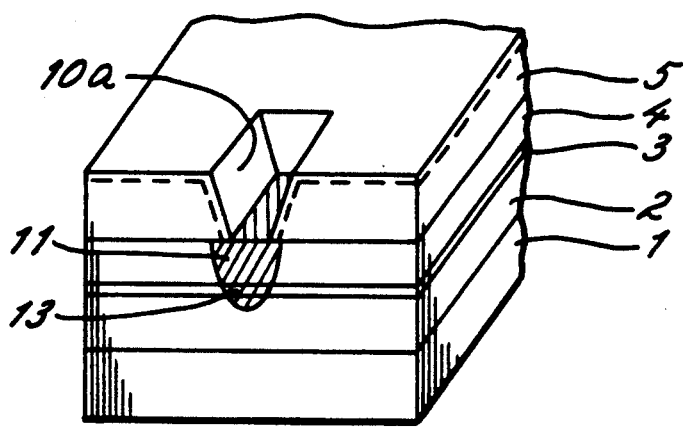
Figure 6A:
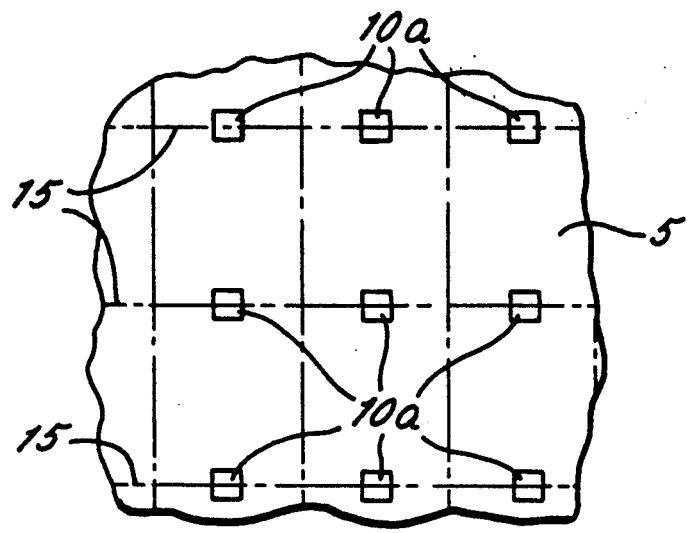
FIGS. 6(a)-6(c) are plan views showing the production process steps of the method shown in FIG. 2.

FIGS. 2(a)-2(f) are cross-sectional perspective views showing the production process steps of a method of producing the laser of FIG. 1. As shown in FIG. 2(a), lower cladding layer 2, active layer 3, first upper cladding layer 4, and current blocking layer 5 are successively grown on substrate 1 by vapor phase epitaxy such as MOCVD (Metal Organic Chemical Vapor Deposition) or MBE (Molecular Beam Epitaxy). In this embodiment, the process steps of forming current confinement groove 10 and the steps of forming the window regions are intermixed as described below. As shown in FIGS. 2(b) and 6(a), apertures 10a are produced at the laser facets by a selective etching using photolithography. In this step, when using a mixed solution of ammonia, hydrogen peroxide, and water as the etching solution, only the GaAs current blocking layer 5 is selectively etched so that the etching is stopped at the interface between current blocking layer 5 and the AlGaAs first upper cladding layer 4. FIG. 6(a) shows a partial plan view of the wafer surface at this stage. The surface of current blocking layer 5 is illustrated, with apertures 10a selectively etched on the wafer. Cleavage assumption lines 15 are shown in FIG. 6(a) to define where the wafer will be cleaved to produce the individual laser devices.

Figure 2C:
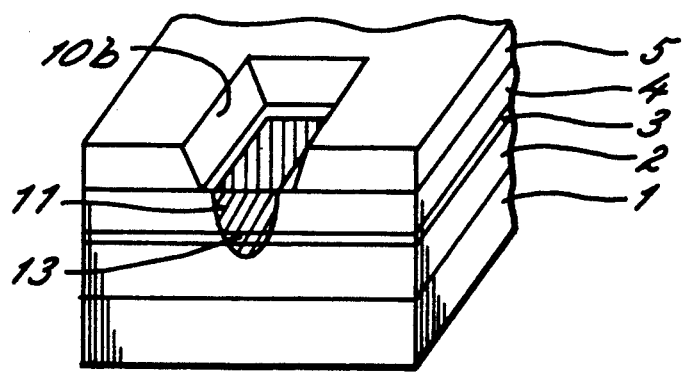
Figure 6B:
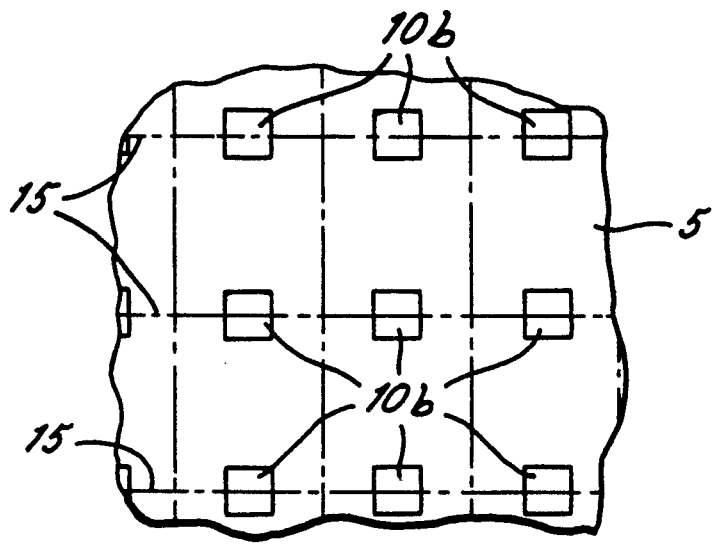

To disorder the multi-quantum well structure of active layer 3, silicon impurities having a concentration of about $3 \times 10^{18}$ cm$^{-3}$ to $1 \times 10^{19}$ cm$^{-3}$ are diffused through apertures 10a to form disordering regions 11 as shown in FIG. 2(b). Typical diffusion conditions for this first diffusion step include the maintenance of a temperature of about 850° C. for a period of approximately one hour. As can be seen, disordering regions 11 extend through first upper cladding layer 4 and invade and disorder the multi-quantum well of active layer 3 to create disordered active layer regions 13. Next, as shown in FIG. 2(c), peripheral portions of apertures 10a are further etched with the same etching solution, to create enlarged apertures 10b. FIG. 6(b) shows a partial plan view of the wafer surface after this process step. As can be seen, apertures 10b shown in FIG. 6(b) are larger than apertures 10a shown in FIG. 6(a).

Figure 2D:
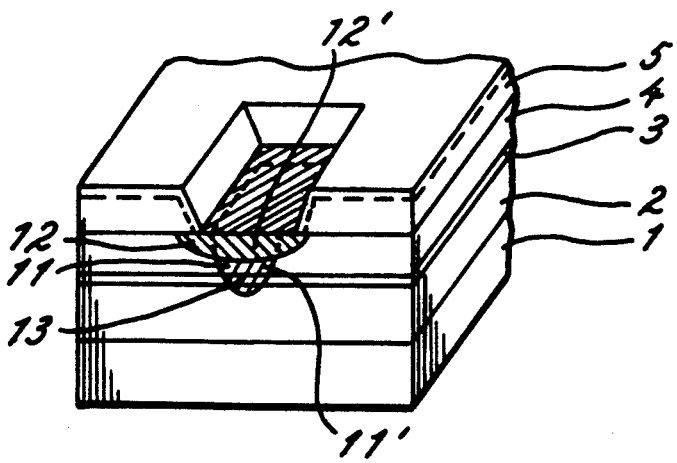

In the next step, in order to complete the window regions, Zn impurities having a higher concentration than the diffused Si impurities are diffused through apertures 10b to form separating regions 12 as shown in FIG. 2(d). The zinc can be diffused at a lower temperature and for a shorter time than the silicon, typical conditions being a temperature of 500° C. maintained for a period of approximately 20 minutes. As can be appreciated from FIG. 2(d), the diffusion front formed by the zinc impurities is broader than that formed by the silicon impurities of the disordering region, and thus the separating regions 12, which extend only into first upper cladding layer 4, partially underlie current blocking layer 5. Because these Zn impurities invert the conductivity type of the upper portion 12' of the disordering regions 11, separating regions 12 separate the n-type current blocking layer 5 from the n-type lower portion 11' of the disordering regions 11. Thus, the potential leakage paths through the impurity defined window regions are eliminated.

Figure 2E:
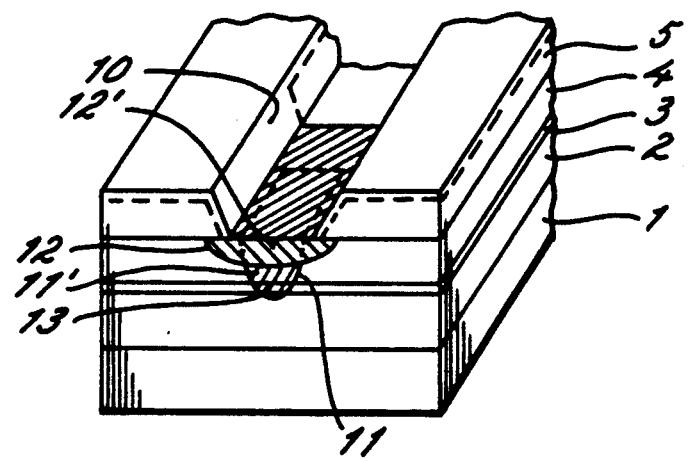
Figure 6C:
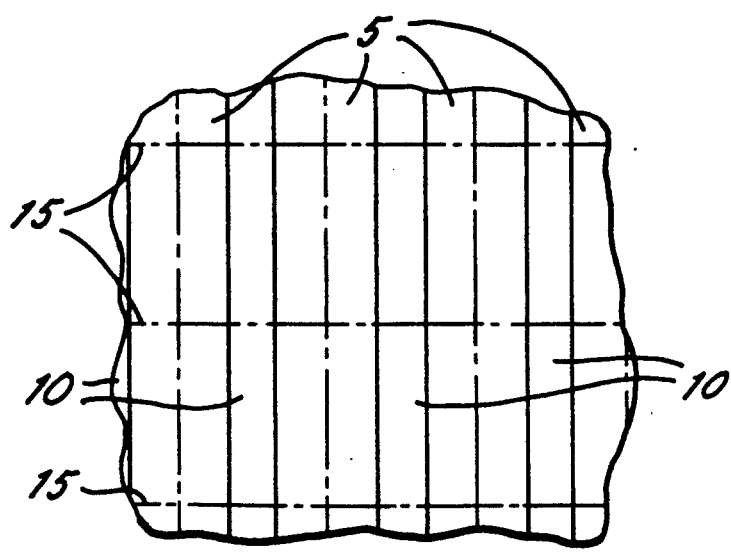

Following the formation of the window regions, the remainder of the central stripe portion of current blocking layer 5 is removed to form stripe shaped current confinement groove 10 as shown in FIG. 2(e). FIG. 6(c) shows a partial plan view of the wafer surface at this process step. As can be seen in FIG. 6(c), current confinement groove 10 extends longitudinally through current blocking layer 5 between the laser facets which will be formed by cleaving the wafer as defined by cleavage assumption lines 15. It will be remembered that current blocking layer 5 and current confinement groove 10 serve two important functions. First, this structure provides a built-in optical waveguide to stabilize the transverse mode. Second, this structure restricts current injection within current confinement groove 10 because of the reversely biased pn junction between current blocking layer 5 and first upper cladding layer 4.

Figure 2F:
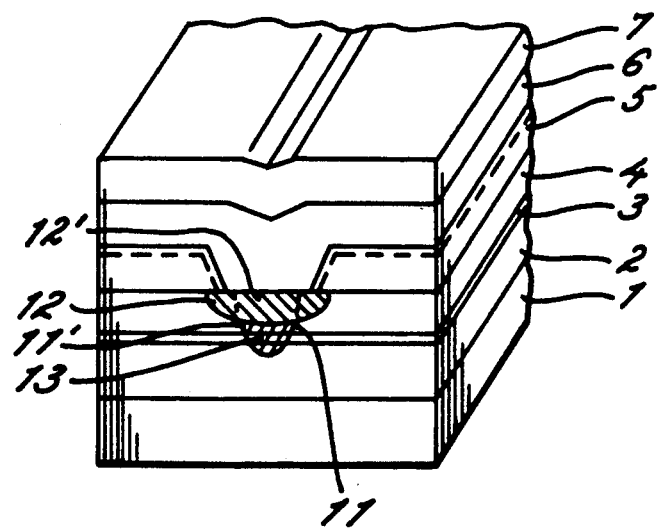

After these diffusion steps, as shown in FIG. 2(f), upper cladding layer 6 and contact layer 7 are successively grown by one of the epitaxial growth processes discussed previously. After this second epitaxial growth process, the portion of active layer 3 in which silicon impurities are introduced to form disordered active layer regions 13 is disordered by annealing for approximately 1 hour at 850° C. Thereafter, metal electrodes 8 and 9 are produced as shown in FIG. 1, and the wafer is separated into chips by cleavage to complete the laser devices in FIG. 1.

Turning now to the operation of the semiconductor laser of the present invention illustrated by the embodiment shown in FIG. 1, when a forward bias voltage is applied to the pn junction across active layer 3, current flows through the device and carriers are injected into active layer 3. Because of the reverse biased pn junction between current blocking layer 5 and first upper cladding layer 4, current can only flow through current confinement groove 10. Thus, current confinement groove 10 defines a channel-like region in active layer 3 into which carriers are injected. As these carriers are injected into the channel-like region of active layer 3, carrier recombination occurs to spontaneously generate photons. The photons are confined to the channel-like region of active layer 3 because of the self-aligned structure. These spontaneously emitted photons will produce low-intensity, incoherent light, and will interact with other excited carriers. These carriers will emit photons, and eventually most of the carrier population can be stimulated to emit photons thereby producing a beam of coherent radiation.

In keeping with the present invention, window regions are produced in the multi-quantum well laser positioned adjacent the laser facets as shown in FIG. 1. These window regions are comprised of disordering regions 11 and separating regions 12. Because the energy band gap of disordered active layer regions 13 is larger than the energy band gap of the multi-quantum well of active layer 3, the laser light emitted from active layer 3 is not absorbed by disordered active layer regions 13, and a non-absorbing mirror structure is produced. Therefore, in the multi-quantum well laser of the present invention, the deterioration at the facets which would unfavorably restrict the maximum light output and device lifetime is prevented, and high power and high reliability operation is realized.

Because the Si impurities used to form disordering regions 11 and disordered active layer regions 13 are n-type, a possible current leakage path would exist between n-type current blocking layer 5 and n-type disordering regions 11 if regions 12 did not separate them. Thus, in accordance with the present invention, separating regions 12 comprised of diffused Zn in this embodiment are provided to obstruct this current leakage path. As can be seen in FIG. 1, the impurities forming separating regions 12 extend only into first upper cladding layer 4 and invert the conductivity type of an upper portion 12' of the disordering regions 11 to separate lower n-type disordering regions 11' from current blocking layer 5.

In order to provide a still more efficient laser, it is desirable to reduce free carrier absorption in the window regions. As reported in Japanese Journal of Applied Physics, Vol. 25-5 L385 to L387 (1986), when Si atoms are used to disorder the multi-quantum well of an active layer, a relatively low Si concentration such as about $3 \times 10^{18} cm^{-3}$ is adequate. Because of this low carrier concentration, free carrier absorption in the window regions is reduced. As a result, superior laser characteristics can be obtained such as a low threshold current and a high external quantum efficiency.

Figure 3A:
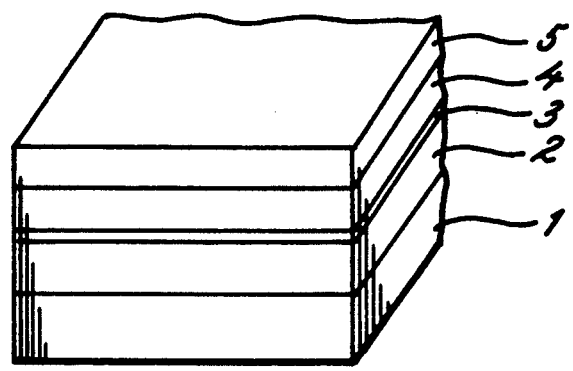
FIGS. 3(a)-3(d) are cross-sectional perspective views showing the production process steps of a method for producing a semiconductor laser device according to a second embodiment of the present invention.
Figure 7A:
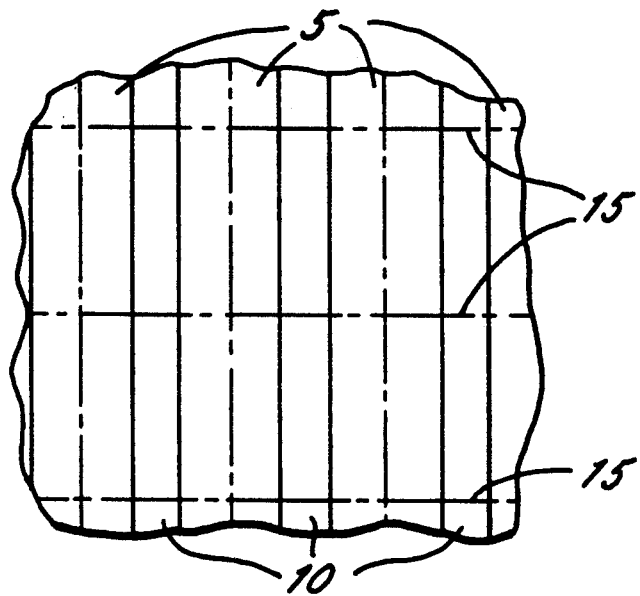
FIGS. 7(a)-7(b) are plan views showing the production process steps of the methods shown in FIGS. 3 or 4.
Figure 7B:
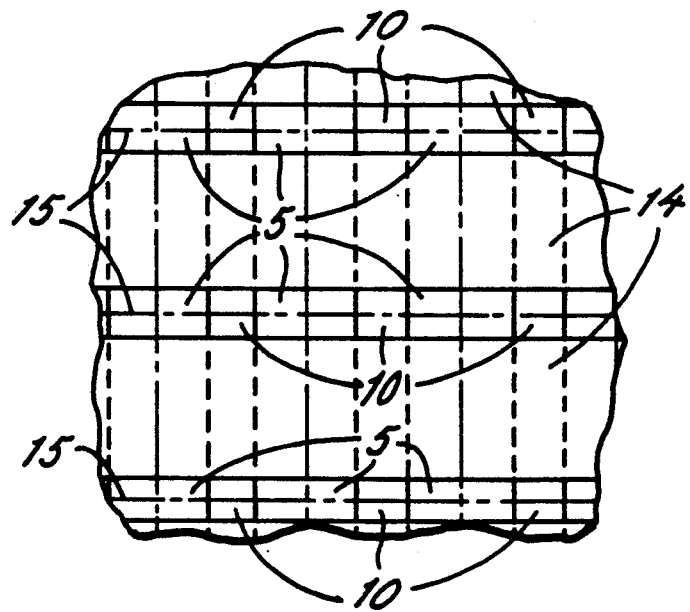

FIGS. 3(a)–3(d) show a production method of a semiconductor laser device according to a second embodiment of the present invention. First, similar to the first embodiment, lower cladding layer 2, active layer 3, first upper cladding layer 4, and current blocking layer 5 are epitaxially grown on substrate 1 as shown in FIG. 3(a). Next, a stripe shaped current confinement groove 10 is produced by selectively etching a central stripe portion of current blocking layer 5 using photolithography and etching techniques. Unlike the first embodiment, current confinement groove 10 is produced by a single etching step in this embodiment. Thus, this process step and the step of forming the window regions are not intermixed. FIG. 7(a) shows a partial plan view of the wafer surface at this process step. As can be seen, current confinement groove 10 extends longitudinally through current blocking layer 5. After current confinement groove 10 is produced, an insulator film 14 having an aperture near the laser facets is produced on current blocking layer 5. Insulator film 14 may be made of any material which functions as a mask for ion implantation and diffusion. For example, a $Si_3N_4$ film which is produced by a thermal chemical vapor deposition method can be used. FIG. 7(b) is a partial plan view showing the wafer surface after insulator film 14 has been produced. As can be seen in FIG. 7(b), insulator film 14 leaves an aperture near the laser facets, which will later be cleaved as shown by cleavage assumption lines 15.

Figure 3B:
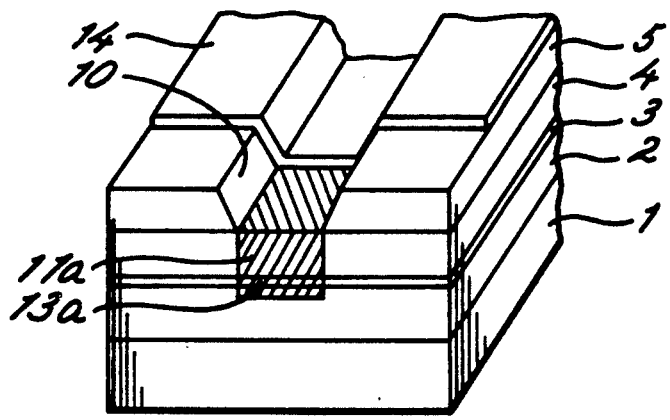
Figure 3C:
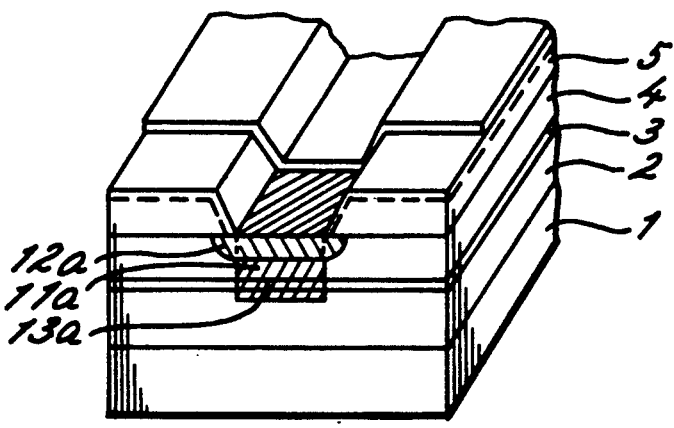
Figure 3D:
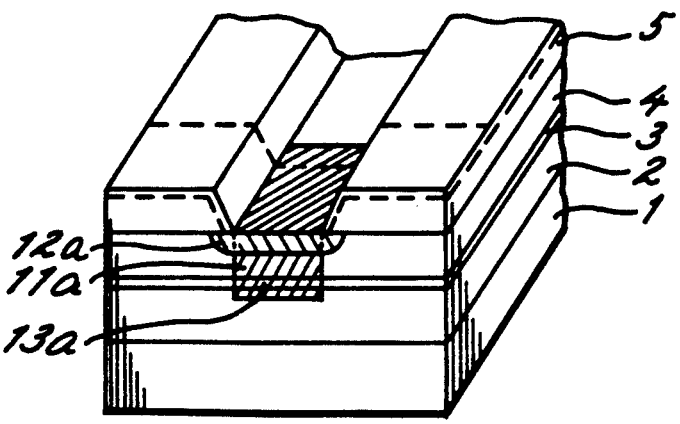

Thereafter, Si impurities are selectively ion implanted using insulator film 14 and current blocking layer 5 as a mask. Implantation of silicon ions can be conducted at approximately 80 keV to achieve a dose of about $3 \times 10^{14}$ cm$^{-2}$. These Si ion-implanted impurities form disordering regions 11a, and extend through active layer 3 to produce disordered active layer regions 13a as can be seen in FIG. 3(b). Next, Zn impurities having a larger carrier concentration than the Si impurities are diffused using the same mask as that used for the ion implantation step. As in the prior embodiment, the zinc diffusion conditions are typically about 500° C. for a period of approximately 20 minutes. These Zn impurities form shallow separating regions 12a which partially underlie current blocking layer 5 as can be seen in FIG. 3(c). Finally, as shown in FIG. 3(d), insulator film 14 is removed, and the same production steps as those in the first embodiment are conducted, thereby completing the laser device.

The operation and characteristics of the semiconductor laser device of the second embodiment shown in FIG. 3 are the same as that of the first embodiment shown in FIGS. 1 and 2. However, in the method of producing this second embodiment, only one etching step is required for producing stripe shaped current confinement groove 10 as is apparent from the above description. Thus, in the second embodiment, the number of process steps needed to fabricate the semiconductor laser of the present invention can be reduced with respect to the first embodiment.

Figure 4A:
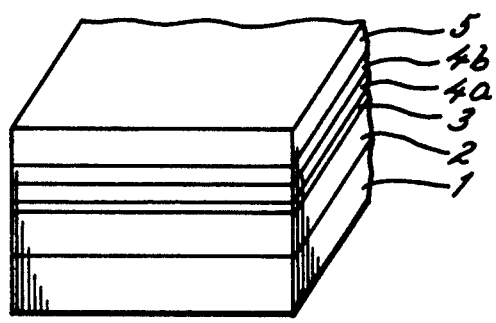
FIGS. 4(a)-4(d) are cross-sectional perspective views showing the production process steps of a method for producing a semiconductor laser device according to a third embodiment of the present invention.
Figure 4B:
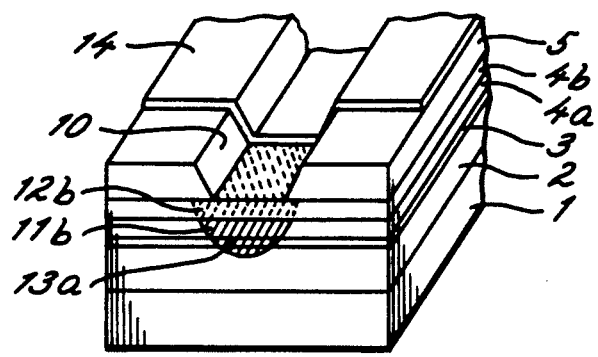
Figure 4C:
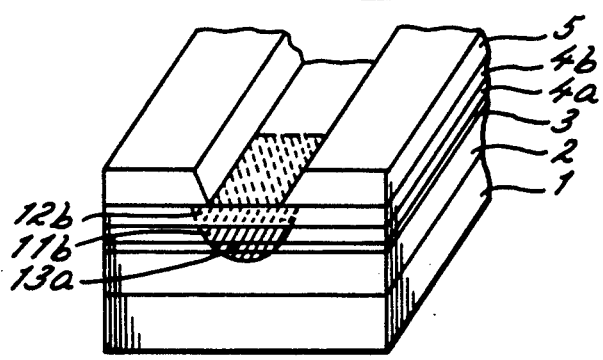
Figure 4D:
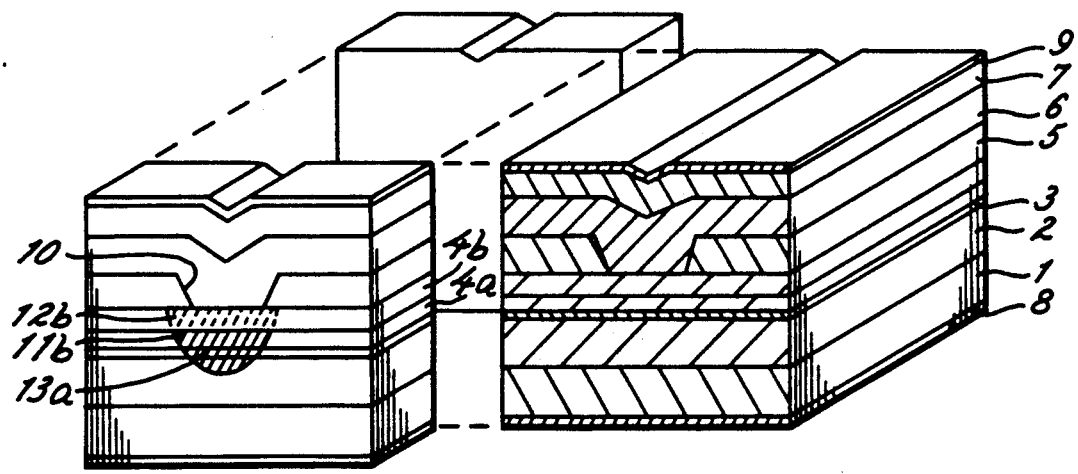

FIGS. 4(a)–4(c) show a production process of a semiconductor laser device according to a third embodiment of the present invention, and FIG. 4(d) shows a cross-sectional perspective view of this embodiment. First, similar to the first and second embodiments, a lower cladding layer 2, an active layer 3 including a multi-quantum well structure, a first upper cladding layer 4, and a current blocking layer 5 are epitaxially grown on a substrate 1 as shown in FIG. 4(a). Unlike the first and second embodiments, p-type first upper cladding layer 4 in this embodiment is comprised of a layer having a low carrier concentration plane 4a near active layer 3, and a high carrier concentration plane 4b above low carrier concentration plane 4a. The carrier concentration of layer 4a in an exemplary embodiment is approximately $1 \times 10^{18} cm^{-3}$, and the carrier concentration of layer 4b is approximately $5 \times 10^{18} cm^{-3}$.

In the above-illustrated embodiment of FIG. 4, a stripe shaped current confinement groove 10 is produced by selectively etching a central stripe portion of current blocking layer 5 using conventional photolithography and etching techniques. FIG. 7(a) shows a partial plan view of the wafer surface after this step. Thereafter, an insulator film 14 having apertures near the laser facets is produced on the wafer surface as shown in FIG. 4(b) and FIG. 7(b). By using insulator film 14 and current blocking layer 5 as a mask, Si impurities are diffused so as to invade active layer 3 as shown in FIG. 4(b). If the Si concentration is made, for example, $4 \times 10^{18} cm^{-3}$, because of the lower and higher carrier concentrations of layers 4a and 4b, disordering regions 11b are compensated to become n-type and separating regions 12b remain p-type. These levels can be achieved using silicon diffusion conditions of about 850° C. conducted for a period of approximately one hour. The impurities of disordering regions 11b invade and disorder active layer 3 to create disordered active layer regions 13a. Separating regions 12b of opposite conductivity type to disordering regions 11b, separate the disordering regions from the current blocking layer 5, thereby preventing a possible current leakage path. Finally, as shown in FIG. 4(c), insulator film 14 is removed, and the same process steps as that of the first and second embodiments are conducted to complete the laser device as shown in FIG. 4(d).

The operation of this third embodiment is similar to that of the first and second embodiments. However, in the production method of this embodiment, impurities used to form the window regions are introduced only once. Thus, in this embodiment, the process steps of the method of producing the semiconductor laser of the present invention can be reduced with respect to the first and second embodiments.

In the above-illustrated embodiments, an AlGaAs laser is described, but the present invention may also be applied to a laser using other material, such as InGaPAs or AlGaInP. In the case of using InGaPAs, such material is typically used for the cladding layers, and the molar proportions are preferably selected to be $In_{1-x}Ga_xP_{1-y}As_y$, where x=0.52 and y=0.01. In the case of a device based on AlGaInP technology, the molar proportions of $Al_xGa_{1-x})y In_{1-y}P$, are x=0.6 and y=0.5 in the cladding layers, x=0.5 and y=0.5 in the barrier layers, and x=0, y=0.5 in the well layers. Further, while the above-illustrated embodiment uses Si for disordering the multi-quantum well of the active layer, the material for disordering the multi-quantum well is not limited thereto, and other impurity atoms such as Se or S may be used. Furthermore, while in the preferred embodiments a multi-quantum well structure is described, it will be appreciated that the invention is equally applicable to laser devices having an active layer which is a single-quantum well structure. It is well known that in a single-quantum well structure, only a single-quantum well is provided but is bracketed by a pair of quantum barrier layers.

As is evident from the foregoing description, according to the present invention, in a quantum well laser having a self-aligned structure, impurities are located adjacent the laser facets which invade and disorder the quantum well of the active layer to produce disordered active layer regions. These first conductivity type disordering regions are separated from the first conductivity type current blocking layer with second conductivity type separating regions which prevent current leakage in the device.

Accordingly, because of the non-absorbing mirror structure produced by forming window regions, catastrophic optical damage can be limited. Thus, the semiconductor laser of the present invention realizes a high power and high reliability operation due to its capability of preventing current leakage, reducing the loss due to free carrier absorption in the window regions, and limiting catastrophic optical damage.

What is claimed is:

1. In a semiconductor laser having opposed first and second facets comprising:
    at least a first conductivity type lower cladding layer, an active layer including a quantum well structure, a second connectivity type first upper cladding layer, a first conductivity type current blocking layer, and a second conductivity type second upper cladding layer successively disposed on a first conductivity type semiconductor substrate, the current blocking layer having a central elongate stripe shaped current confinement groove extending between the facets;
    dopant impurities of the first conductivity type penetrating the first upper cladding layer and forming disordering regions positioned adjacent the facets which invade and disorder the quantum well to create disordered active layer regions; and
    dopant impurities of the second conductivity type penetrating an upper portion of the first upper cladding layer and forming separating regions positioned adjacent the facets which separate the current blocking layer and the disordering regions to prevent current leakage between the current blocking layer and the disordering regions.

2. The semiconductor laser of claim 1 wherein the separating regions are wider than the current confinement groove and partially underlie the current blocking layer.

3. The semiconductor laser of claim 1 wherein the dopant impurities of the separating regions are of a concentration sufficient to invert the conductivity type of an upper portion of the disordering regions into the second conductivity type to prevent current leakage between the current blocking layer and the disordering regions.

4. The semiconductor laser of claim 1 wherein the first conductivity type is n-type and the second conductivity type is p-type.

5. The semiconductor laser of claim 4 wherein the dopant impurities of the disordering regions are comprised of diffused Si having a concentration of about $1\times10^{18}$cm$^{-3}$ to $1\times10^{19}$cm$^{-3}$.

6. The semiconductor laser of claim 5 wherein the concentration of Si is preferably $3\times10^{18}$cm$^{-3}$.

7. The semiconductor laser of claim 4 wherein the separating regions are comprised of diffused p-type dopant impurities.

8. The semiconductor laser of claim 4 wherein the disordering regions are comprised of n-type ion-implanted dopant impurities and the separating regions are comprised of p-type diffused dopant impurities.

9. The semiconductor laser of claim 4 wherein the p-type first upper cladding layer comprises a first plane of low carrier concentration near the active layer and a second plane of high carrier concentration above the first plane.

10. The semiconductor laser of claim 9 wherein the impurities forming the disordering regions and the separating regions are diffused n-type impurities, the impurities having a lower carrier concentration than the plane of high carrier concentration, and a higher carrier concentration than the plane of low carrier concentration, such that the conductivity type of the separating regions remains p-type, and the conductivity type of the disordering regions is inverted to n-type.

11. In a semiconductor laser having at least one facet comprising, in combination:

at least upper and lower cladding layers separated by an active layer, the lower cladding layer being of a first conductivity type, the active layer being a quantum well structure, the upper cladding layer being of a second conductivity type, a current blocking layer associated with the upper cladding layer and being of the same conductivity type as the lower cladding layer, the current blocking layer having a central stripe shaped current confinement groove terminating in said one facet;

a window region at the facet, the window region including a disordering region penetrating the upper cladding layer and invading the active layer to create a disordered active layer region at the facet formed by dopant impurities introduced at said window, said dopant impurities being of the first conductivity type; and a separating region at the facet penetrating an upper portion of the upper cladding layer and interposed between the disordering region and the current blocking layer, the separating region being formed of dopant impurities of the second conductivity type and interposed between the disordering region and the current blocking layer for preventing current flow therebetween.

* * * * *